US009001508B2

(12) United States Patent
Mori et al.

(10) Patent No.: US 9,001,508 B2
(45) Date of Patent: Apr. 7, 2015

(54) OPENABLE AND CLOSABLE ELECTRONIC DEVICE WITH DISPLAY

(71) Applicant: Panasonic Corporation, Kadoma-shi, Osaka (JP)

(72) Inventors: Takeshi Mori, Osaka (JP); Hitoshi Nakatani, Osaka (JP); Shun Shimazaki, Osaka (JP); Yuichiro Tachibana, Osaka (JP); Shuji Yasuoka, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 199 days.

(21) Appl. No.: 13/765,450

(22) Filed: Feb. 12, 2013

(65) Prior Publication Data

US 2014/0055922 A1 Feb. 27, 2014

(30) Foreign Application Priority Data

Aug. 24, 2012 (JP) ................................ 2012-185584

(51) Int. Cl.
| | | |
|---|---|---|
| *H05K 5/00* | (2006.01) | |
| *H05K 5/02* | (2006.01) | |
| *G06F 1/16* | (2006.01) | |

(52) U.S. Cl.
CPC ............ *H05K 5/0217* (2013.01); *H05K 5/0017* (2013.01); *G06F 1/162* (2013.01)

(58) Field of Classification Search
USPC ..................................................... 361/679.55
See application file for complete search history.

(56) References Cited

U.S. PATENT DOCUMENTS

| | | | | | |
|---|---|---|---|---|---|
| 5,144,290 | A | * | 9/1992 | Honda et al. ................... | 345/156 |
| 5,196,991 | A | * | 3/1993 | Hsieh ......................... | 361/679.17 |
| 5,796,576 | A | * | 8/1998 | Kim ........................... | 361/679.28 |
| 7,576,982 | B2 | * | 8/2009 | Wang et al. .............. | 361/679.27 |
| 7,619,882 | B2 | * | 11/2009 | Nakajima et al. ......... | 361/679.26 |
| 7,800,893 | B2 | * | 9/2010 | Tracy et al. ............... | 361/679.27 |
| 7,974,091 | B2 | * | 7/2011 | Griffin ...................... | 361/679.56 |
| 8,208,245 | B2 | * | 6/2012 | Staats et al. ............... | 361/679.02 |
| 2004/0105227 | A1 | * | 6/2004 | Tanimoto et al. ............ | 361/683 |
| 2006/0256516 | A1 | * | 11/2006 | Cho ............................... | 361/683 |
| 2011/0085297 | A1 | * | 4/2011 | Wright-Johnson et al. ......................... | 361/679.55 |
| 2011/0127184 | A1 | * | 6/2011 | Kawada et al. ............... | 206/320 |

FOREIGN PATENT DOCUMENTS

JP 2004-094647 3/2004

* cited by examiner

*Primary Examiner* — Lisa Lea Edmonds
(74) *Attorney, Agent, or Firm* — Hamre, Schumann, Mueller & Larson, P.C.

(57) ABSTRACT

An electronic device (100) includes: a first casing (101); a second casing (102) that is connected to the first casing (101), and that has a display (103); a projecting component (152) that projects from a top side surface (101*a*) of the first casing (101), and is positioned on the top side surface (101*a*) of the first casing (101) at such a position as to abut against the display (103) when the electronic device (100) is closed; and a movable support section (170) configured to support the projecting component (152) so as to allow the projecting component (152) to move relative to the first casing (101) such that an amount of projection of the projecting component (152) from the top side surface (101*a*) of the first casing (101) is reduced when the projecting component (152) is pushed by the display (103) in the case of the electronic device (100) being closed.

10 Claims, 7 Drawing Sheets

(a)

(b)

(c)

ABUTTING POSITION AGAINST DISPLAY

OPENABLE AND CLOSABLE ELECTRONIC DEVICE WITH DISPLAY

BACKGROUND

1. Field

The present disclosure relates to an electronic device that has a first casing and a second casing having a display, and that is openable and closable.

2. Description of the Related Art

Japanese Laid-Open Patent Publication No. 2004-094647 discloses an electronic device that includes a main unit, a display unit, and a hinge mechanism having a first shaft for connecting the display unit to the main unit so as to be openable and closable, and a second shaft for connecting the display unit to the main unit so as to rotate the display unit horizontally relative to the main unit. Hollow leg sections of the display unit each have an engagement component accommodated therein. The engagement component has a shaft-like shape that has a regular octagonal cross-section. The engagement component is supported by a housing of the display unit. The display unit includes a pair of operation levers. The operation levers are each used for moving the engagement component to an engagement position or a disengagement position, according to an operator's manual operation. At the engagement position, the engagement component is moved into a recess of a brake shaft, and engages with an inner surface of the recess. The brake shaft is supported, by a bracket fixed to a casing of the main unit, so as to be rotatable. When the display unit is rotated from a closed position to an open position, the rotation of the display unit is conveyed to the brake shaft through the engagement component, and a torque for the rotation is divided so as to be applied to both the hinge mechanism and the brake shaft.

SUMMARY

The present disclosure is to make available an electronic device effective for reducing an external force applied to a display in a case where a projecting component of a first casing abuts against the display of a second casing when the electronic device is closed.

An electronic device of the present disclosure includes: a first casing; a second casing connected to the first casing such that the electronic device is openable and closable, the second casing having a display provided on a surface on the first casing side; a projecting component that projects from a top side surface of the first casing, and is positioned on the top side surface of the first casing at such a position as to abut against the display when the electronic device is closed; and a movable support section configured to support the projecting component so as to allow the projecting component to move relative to the first casing such that an amount of projection of the projecting component from the top side surface of the first casing is reduced when the projecting component is pushed by the display in the case of the electronic device being closed.

The electronic device of the present disclosure is effective for reducing an external force applied to the display in a case where the projecting component of the first casing abuts against the display of the second casing when the electronic device is closed.

DETAILED DESCRIPTION

Hereinafter, embodiments will be described in detail with reference to the drawings as appropriate. However, there will be instances in which detailed description beyond what is necessary is omitted. For example, detailed description of subject matter that is previously well-known, as well as redundant description of components that are substantially the same will in some cases be omitted. This is to prevent the following description from being unnecessarily lengthy, in order to facilitate understanding by a person of ordinary skill in the art.

The inventors provide the following description and the accompanying drawings in order to allow a person of ordinary skill in the art to sufficiently understand the present disclosure, and the description and the drawings are not intended to restrict the subject matter of the scope of patent claims.

First Embodiment

Hereinafter, a first embodiment will be described with reference to FIGS. 1 to 8.

[1-1. Entire Configuration of Electronic Device]

Figure 1:
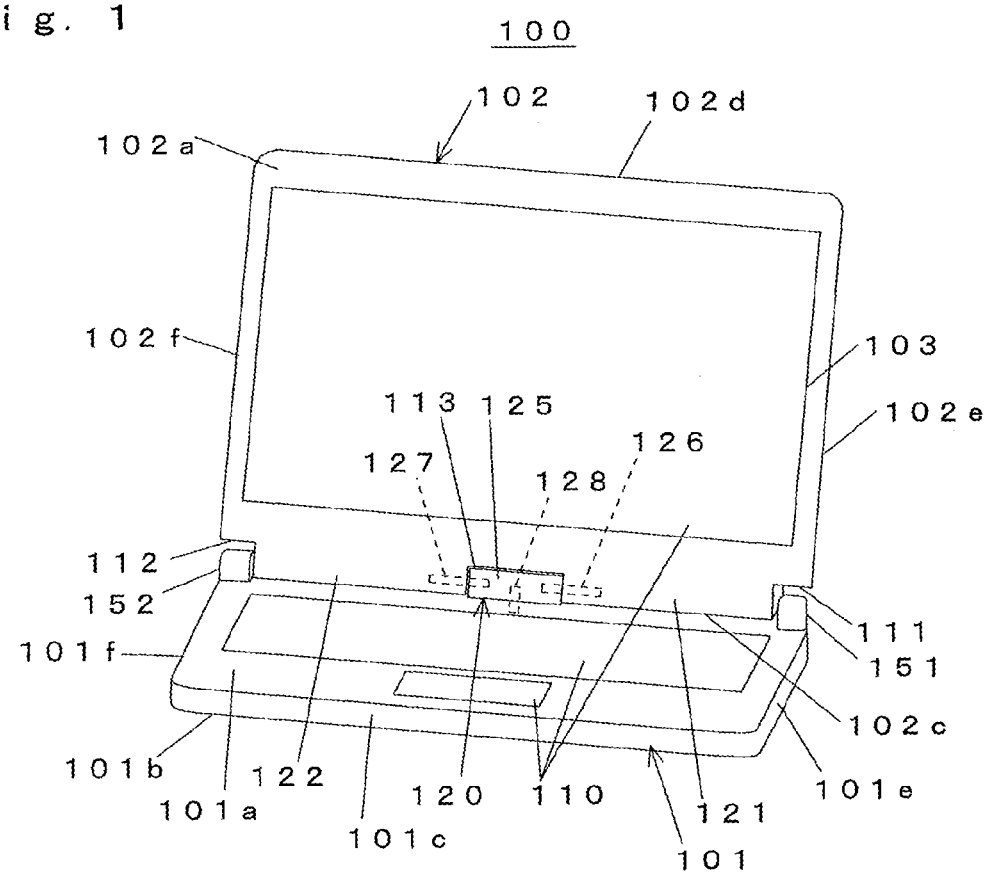
FIG. 1 is a perspective view illustrating a normally opened position of an electronic device according to a first embodiment.
Figure 2:
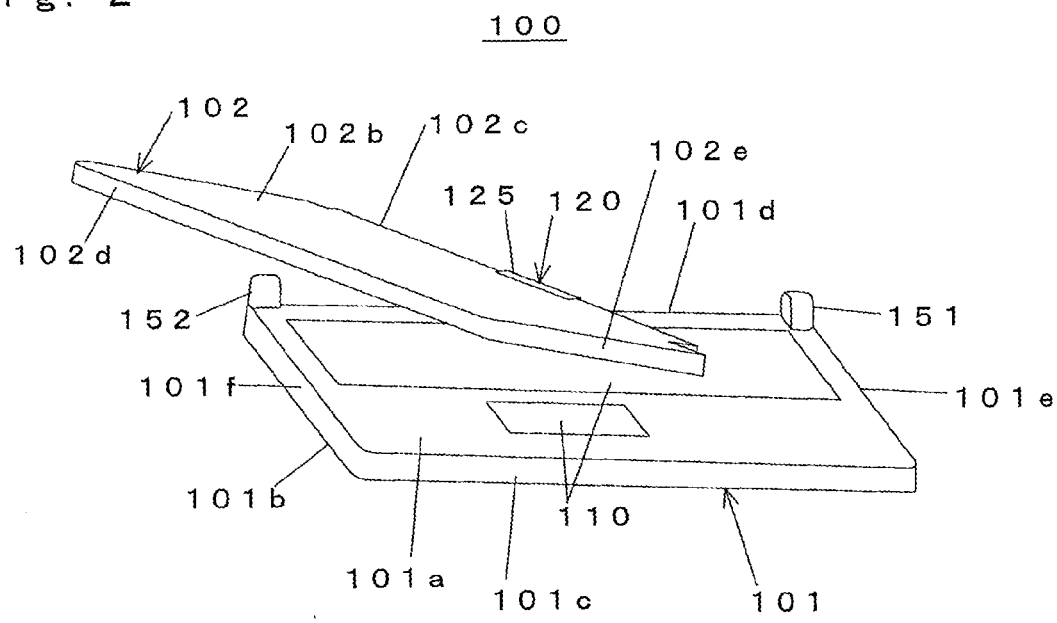
FIG. 2 is a perspective view illustrating a state where a second casing is tilted in the course of switching between the normally opened position and an inversely opened position, in the electronic device according to the first embodiment.

FIG. 1 is a perspective view illustrating a normally opened position of an electronic device 100 according to the present embodiment. FIG. 2 is a perspective view illustrating a state where a second casing 102 is tilted in the course of switching between the normally opened position and an inversely opened position, in the electronic device 100 according to the present embodiment.

As shown in FIG. 1, the electronic device 100 of the present embodiment is a notebook computer which is one example of an information processing apparatus. The electronic device 100 includes a first casing 101 having an operation section 110 provided on a top surface 101a, the second casing 102 having a display 103 provided on a front surface 102a, and a hinge mechanism 120 connecting a rear side portion of the first casing 101 to a lower side portion of the second casing 102. The operation section 110 is structured so as to receive an operation from a user of the electronic device 100, and is implemented as, for example, a keyboard, a touch pad, and a touch panel. The touch panel is disposed so as to overlap the display 103.

In the following description, the hinge mechanism 120 side of the first casing 101 is referred to as "far side" or "rear side", and a side opposite thereto is referred to as "near side" or "front side". Further, a surface that extends in the front-rear direction, among the outer circumferential surfaces (the surfaces of the first casing 101 which extend in the thickness direction) of the first casing 101, is referred to as "side surface".

As shown in FIG. 1 and FIG. 2, the first casing 101 is a thin casing having a roughly rectangular shape as viewed in a planar manner. The first casing 101 has the top surface 101a, a back surface 101b, a front side end face 101c, a rear side end face 101d, a first side surface 101e, and a second side surface 101f. The first casing 101 has a CPU, a memory (for example, an HDD), a battery, and the like mounted therein (not shown). The keyboard and the touch pad of the operation section 110 as described above are provided on the top surface 101a of the first casing 101. For example, a portion through which the battery is removed is provided on the back surface 101b of the first casing 101 (not shown). A connection terminal for an electrical cord, a connection port (for example, a USB port) for a peripheral device, and the like are provided on the rear side end face 101d of the first casing 101 (not shown).

As shown in FIG. 1 and FIG. 2, the second casing 102 is a thin casing having a roughly rectangular shape as viewed in a planar manner. The second casing 102 has the front surface 102a, a back surface 102b, a base end face 102c, a top end face 102d, a first side surface 102e, and a second side surface 102f. The shape and size of the second casing 102 are almost the same as the shape and size of the first casing 101, as viewed in the planar manner. In the second casing 102, the display 103 occupies a large part of the front surface 102a. The display 103 of the second casing 102 is opposed to the keyboard of the first casing 101 in a closed state in which the first casing 101 and the second casing 102 are overlaid with each other. Hereinafter, the closed state where the first casing 101 is overlaid with the entirety of the second casing 102, and the display 103 is opposed to the keyboard, is referred to as a normally closed position. In the second casing 102, the back surface 102b opposite to the display 103 is a shield surface for protecting the electronic device 100.

The second casing 102 has a first cut portion 111, a second cut portion 112, and a third cut portion 113 formed on a base end side (a lower side in FIG. 1) on which the hinge mechanism 120 is connected. The first cut portion 111 is formed at one end (the right hand edge in FIG. 1), on the base end side, of the second casing 102. The second cut portion 112 is formed at the other end (the left hand edge in FIG. 1), on the base end side, of the second casing 102. The third cut portion 113 is formed at almost the center portion, on the base end side, of the second casing 102.

Further, on the base end side of the second casing 102, a first projecting case component 121 is provided between the first cut portion 111 and the third cut portion 113, and a second projecting case component 122 is provided between the second cut portion 112 and the third cut portion 113. The first projecting case component 121 and the second projecting case component 122 are each a case component that projects on the base end side of the second casing 102, and that has a roughly rectangular parallelepiped shape. The first projecting case component 121 and the second projecting case component 122 form a part of the second casing 102.

The hinge mechanism 120 is formed as a so-called two-axis hinge. The hinge mechanism 120 connects between the rear side portion of the first casing 101 and the base end side portion of the second casing 102 such that the electronic device 100 is openable and closable, and the second casing 102 is rotatable relative to the first casing 101 in a state where the electronic device 100 is opened, so as to switch between the normally opened position where the display 103 faces the first casing 101 side, and the inversely opened position where the display 103 faces a side opposite to the side which the display 103 faces in the normally opened position.

Specifically, the hinge mechanism 120 includes: a housing 125 that is disposed in the third cut portion 113 and has a roughly rectangular parallelepiped shape; opening and closing axial-components 126 and 127 for opening and closing the electronic device 100; and an inverting axial-component 128 for inverting the second casing 102, as shown in FIG. 1. The opening and closing axial-components 126 and 127 are formed as two axial-components. The two opening and closing axial-components, 126 and 127, are provided so as to be parallel to the base end face 102c of the second casing 102 and coaxial with each other. One of the opening and closing axial-components, 126 and 127, that is, the opening and closing axial-component 126 in the present embodiment, has one end portion supported by an axial-component receiving section (not shown) in the housing 125 so as to be rotatable, and has the other end portion supported by an axial-component receiving section (not shown) in the first projecting case component 121 so as to be rotatable. The other of the opening and closing axial-components, 126 and 127, that is, the opening and closing axial-component 127 in the present embodiment, has one end portion supported by an axial-component receiving section (not shown) in the housing 125 so as to be rotatable, and has the other end portion supported by an axial-component receiving section (not shown) in the second projecting case component 122 so as to be rotatable. The inverting axial-component 128 extends in the thickness direction of the first casing 101. The inverting axial-component 128 has one end portion supported by an axial-component receiving section (not shown) in the housing 125, so as to be rotatable, and the other end portion supported by an axial-component receiving section (not shown) in the first casing 101, so as to be rotatable.

The electronic device 100 switches from the normally closed position to the normally opened position where a user is allowed to view the display 103, by the second casing 102 pivoting about the opening and closing axial-components 126 and 127 and opening so as to move away from the front side portion of the first casing 101. In the normally opened position, the display 103 faces the first casing 101 side. The electronic device 100 switches from the normally opened position to the inversely opened position where the display 103 faces a side opposite to the first casing 101 side, by the second casing 102 pivoting about the inverting axial-component 128 so as to rotate relative to the first casing 101. The electronic device 100 switches from the inversely opened position to the inversely closed position where the electronic device 100 is closed with the display 103 facing the side opposite to the first casing 101 side, by the second casing 102 pivoting about the opening and closing axial-components 126 and 127 and closing so as to approach the front side portion of the first casing 101. When the second casing 102 is moved in a direction opposite to the direction in which the normally closed position is changed to the inversely closed position, the electronic device 100 is returned from the inversely closed position to the normally closed position through the inversely opened position and the normally opened position.

Figure 3:
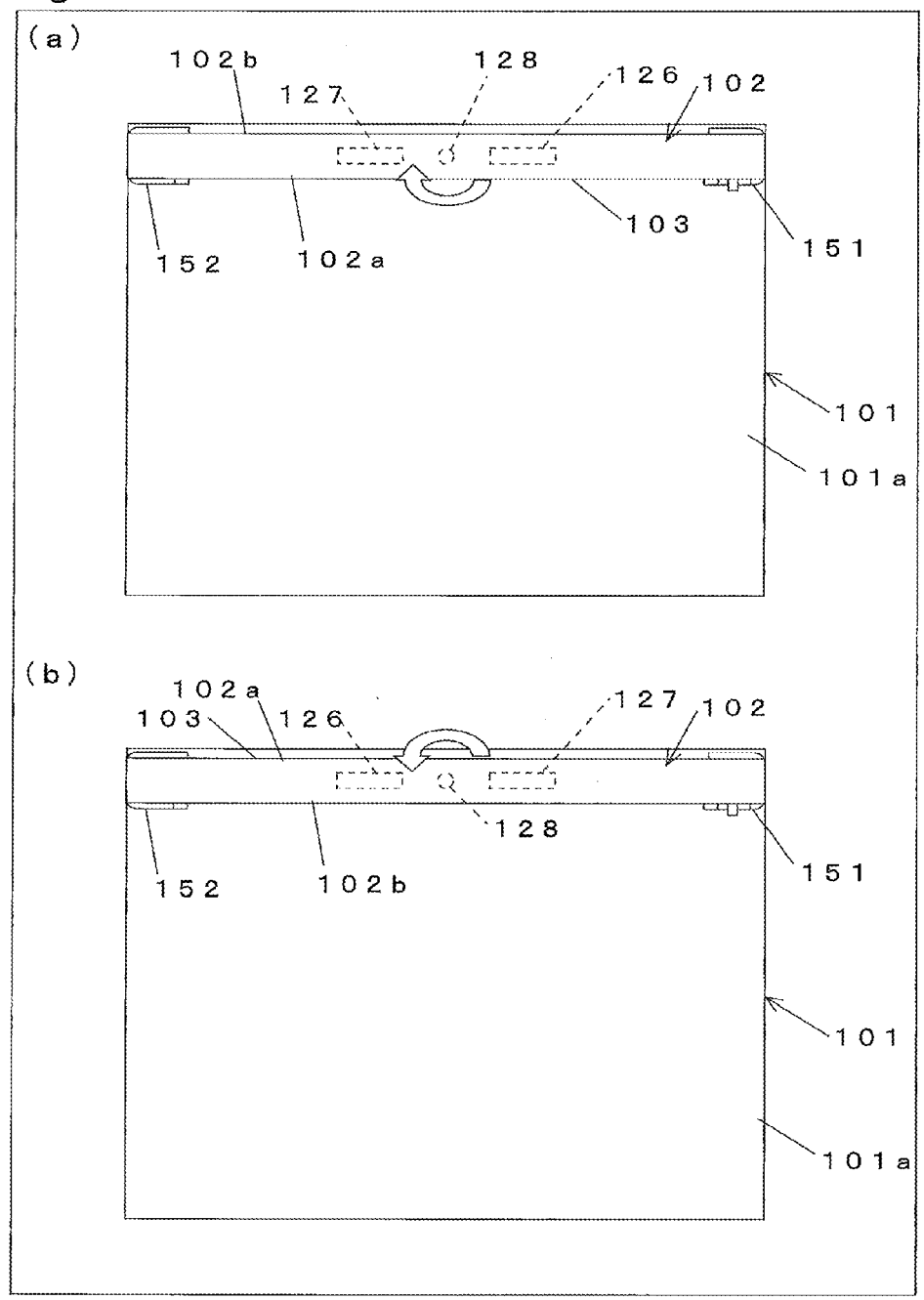
FIG. 3 is a schematic diagram illustrating a range in which the second casing is allowed to rotate about an inverting axial-component in the first embodiment.

The hinge mechanism 120 is structured such that a range of directions in which the display 103 is allowed to face when switching between the normally opened position and the inversely opened position is being performed, is limited to almost half a range of the entire circumference around the inverting axial-component 128. FIG. 3 is a schematic diagram illustrating a range in which the second casing 102 is allowed to rotate about the inverting axial-component 128. Specifically, the hinge mechanism 120 is structured such that, in the course of the normally opened position being switched to the inversely opened position, the second casing 102 is allowed to rotate relative to the first casing 101 only in a first rotation direction (the clockwise direction as viewed from above the electronic device 100) that causes the display 103 to face a second support component 152 described below, as shown in FIG. 3(a). Further, the hinge mechanism 120 is structured such that, in the course of the inversely opened position being switched to the normally opened position, the second casing 102 is allowed to rotate relative to the first casing 101 only in a second rotation direction (the counterclockwise direction as viewed from above the electronic device 100) opposite to the first rotation direction, as shown in FIG. 3(b). The first rotation direction and the second rotation direction are each a direction of rotation about the inverting axial-component 128.

Further, as shown in FIG. 2, the hinge mechanism 120 is structured such that, also in the course of the switching between the normally opened position and the inversely opened position, the second casing 102 is allowed to rotate relative to the first casing 101 by pivoting about the opening and closing axial-components 126 and 127.

[1-2. Structure of Support Assisting Section]

The electronic device 100 further includes a support assisting section 150 for assisting the hinge mechanism 120 in supporting the second casing 102. The support assisting section 150 includes a first auxiliary axial-component 141, a second auxiliary axial-component 142, a first support component 151, and the second support component 152.

Figure 4:
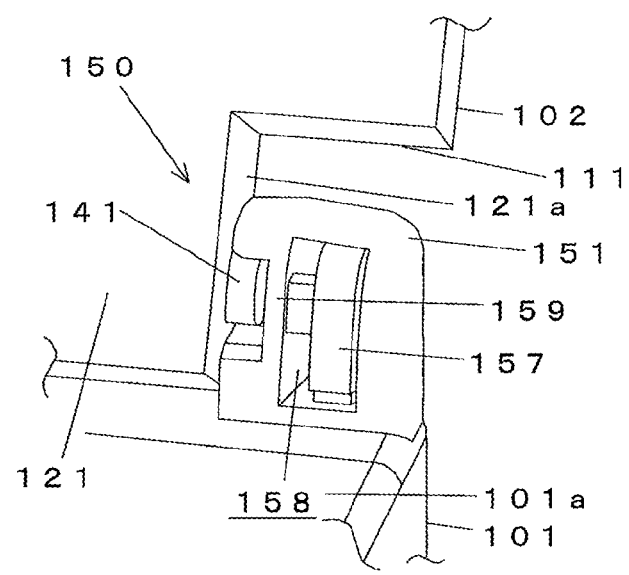
FIG. 4 illustrates a first support component of the electronic device according to the first embodiment.
Figure 4:
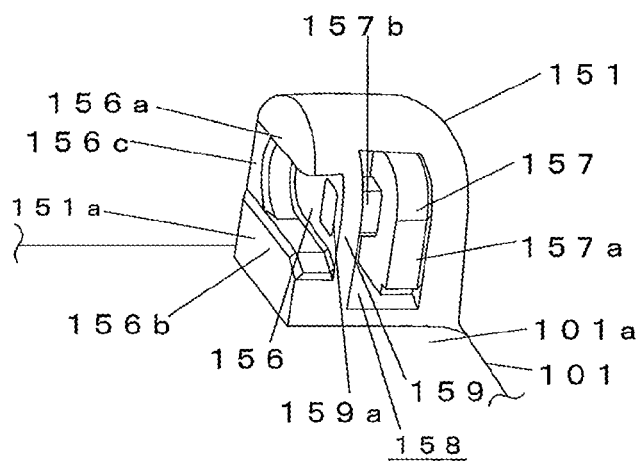
Figure 4:
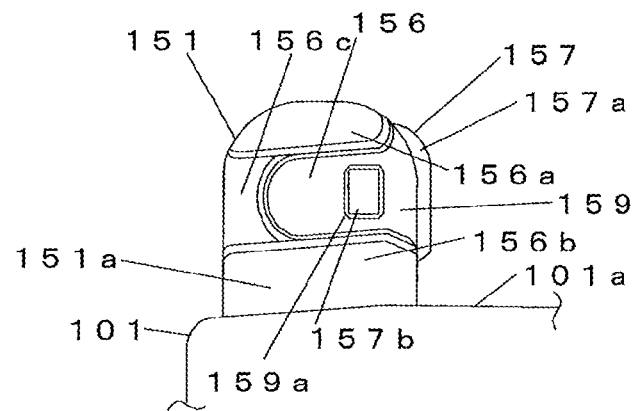
Figure 5:
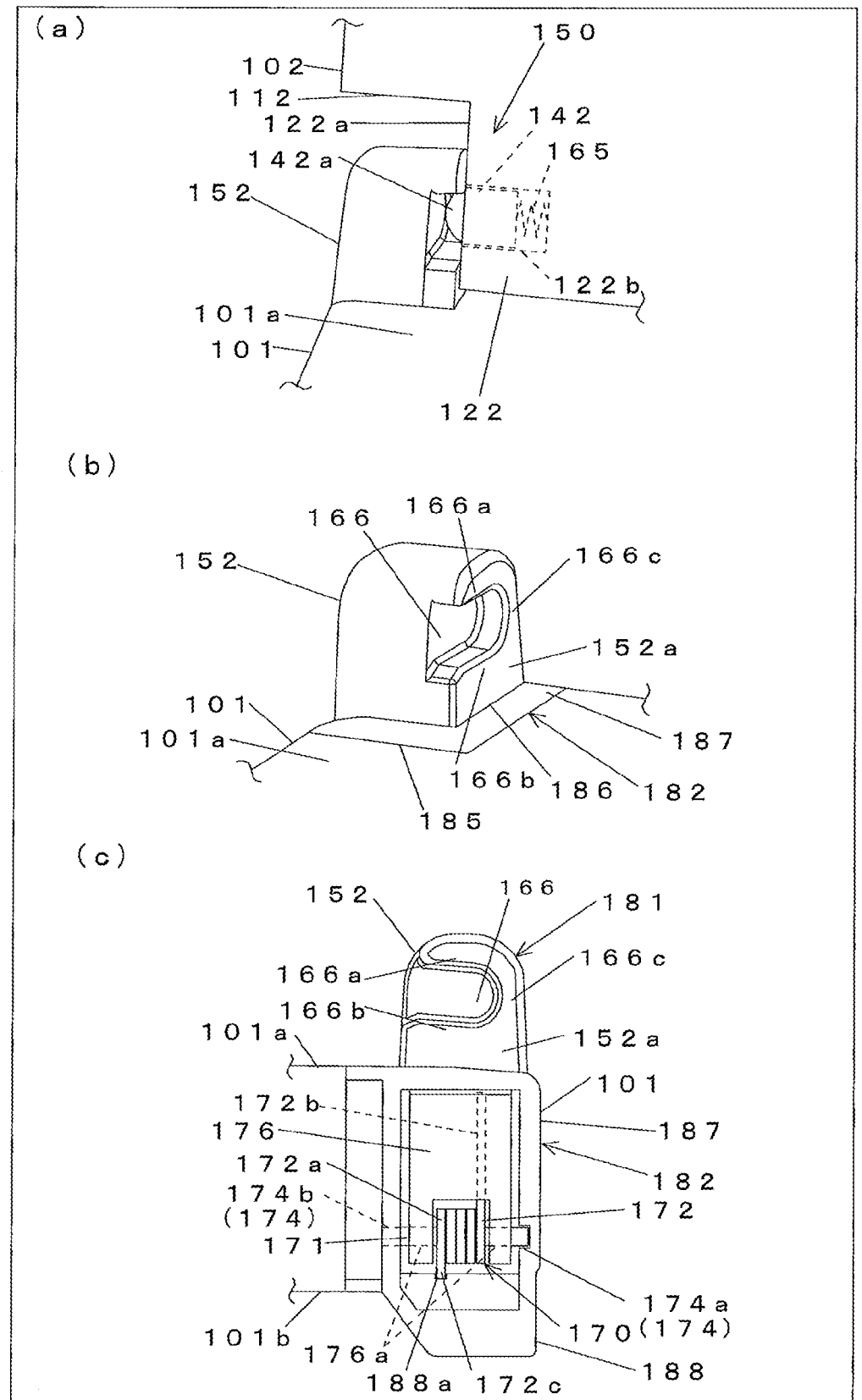
FIG. 5 illustrates a second support component of the electronic device according to the first embodiment.

FIG. 4 illustrates the first support component 151 of the electronic device 100 according to the present embodiment. FIG. 4(a) is a perspective view of the first support component 151 having the first auxiliary axial-component 141 fitted therein, FIG. 4(b) is a perspective view of the first support component 151 which does not have the first auxiliary axial-component 141 fitted therein, and FIG. 4(c) is a front view of an inner surface 151a of the first support component 151. FIG. 5 illustrates the second support component 152 of the electronic device 100 according to the present embodiment. FIG. 5(a) is a perspective view of the second support component 152 having the second auxiliary axial-component 142 fitted therein, FIG. 5(b) is a perspective view of the second support component 152 which does not have the second auxiliary axial-component 142 fitted therein, and FIG. 5(c) is a front view of an inner surface 152a of the second support component 152.

The first auxiliary axial-component 141 projects on an outer side surface 121a of the first projecting case component 121 as shown in FIG. 4(a). The first auxiliary axial-component 141 is formed as an axial-component having a flat top surface and having a roughly circular-cylindrical shape. Further, the second casing 102 having provided therein the first auxiliary axial-component 141 as the axial-component forms a casing having an axial-component. The first auxiliary axial-component 141 is disposed on an extended line of the axes of the opening and closing axial-components 126 and 127 as shown in FIG. 6(a) indicated below. The first auxiliary axial-component 141 is coaxial with the opening and closing axial-components 126 and 127. The first auxiliary axial-component 141 is fixed to the first projecting case component 121. Therefore, if the top surface of the first auxiliary axial-component 141 is pushed toward the inner side of the first projecting case component 121, the first auxiliary axial-component 141 does not move, and an amount of projection of the first auxiliary axial-component 141 is not changed.

The second auxiliary axial-component 142 projects on an outer side surface 122a of the second projecting case component 122 as shown in FIG. 5(a). The second auxiliary axial-component 142 has a roughly circular-cylindrical shape and a top portion 142a which is rounded. The top portion 142a is formed in a semispherical shape. The second auxiliary axial-component 142 is disposed on an extended line of the axes of the opening and closing axial-components 126 and 127 as shown in FIG. 6(a). The second auxiliary axial-component 142 is coaxial with the opening and closing axial-components 126 and 127. The support assisting section 150 further includes an elastic component (for example, a coil spring) 165 for urging the second auxiliary axial-component 142 as shown in FIG. 5(a). The elastic component 165 is a component for changing an amount of projection of the second auxiliary axial-component 142 from the outer side surface 122a of the second projecting case component 122.

For example, the second projecting case component 122 has formed therein a mounting hole 122b in which the second auxiliary axial-component 142 and the elastic component 165 are mounted. The mounting hole 122b is open on the outer side surface 122a. The elastic component 165 has one end connected to a bottom surface of the mounting hole 122b, and has the other end connected to a base end face of the second auxiliary axial-component 142. An edge portion around the mounting hole 122b projects slightly inward so as not to disengage the elastic component 165. Further, even when an amount of projection of the second auxiliary axial-component 142 from the outer side surface 122a is maximum, the elastic component 165 is contracted, and pushes the second auxiliary axial-component 142 outward. In this state, the second auxiliary axial-component 142 is caught by the edge portion around the mounting hole 122b, and the second auxiliary axial-component 142 is not disengaged from the mounting hole 122b. When the top portion 142a of the second auxiliary axial-component 142 is pushed toward an inner side of the second projecting case component 122, the contraction of the elastic component 165 is enhanced, to move the second auxiliary axial-component 142 inward (rightward in FIG. 5(a)). When a force for pushing the top portion 142a of the second auxiliary axial-component 142 is removed, the elastic component 165 is extended, to return the second auxiliary axial-component 142 to an original position. An amount of projection of the second auxiliary axial-component 142 is changed according to a force applied to the top portion 142a of the second auxiliary axial-component 142.

The first support component 151 is provided on one corner portion (the right far side corner portion in FIG. 1) on the far side of the top surface 101a of the first casing 101. The first support component 151 is a small projection having a rounded top portion as shown in FIG. 4. The first support component 151 projects from the top surface 101a of the first casing 101. The first support component 151 is fixed to the first casing 101. The first support component 151 corresponds to a first axial-component receiving section having a recess 156 into which the first auxiliary axial-component 141 fits in the normally opened position. The first support component 151 supports the first auxiliary axial-component 141 on a wall surface of the recess 156.

The first support component 151 has the recess 156 formed, in almost a U-shape, on an inner surface 151a that is opposed to the outer side surface 121a of the first projecting case component 121 in the normally opened position, as shown in FIG. 4(c). In the first support component 151, the recess 156 is open on the front side thereof. The recess 156 includes an upper axial-component support wall 156a, a lower axial-component support wall 156b, and a rear side axial-component stop wall 156c, as shown in FIG. 4(b). The upper axial-component support wall 156a, the lower axial-component support wall 156b, and the rear side axial-component stop wall 156c extend almost perpendicular to the bottom surface of the recess 156 through a haunch. In the first support component 151, the axial-component stop wall 156c prevents passing of the first auxiliary axial-component 141. The height (the height from the bottom surface of the recess 156 to the top end of the axial-component stop wall 156c) of the axial-component stop wall 156c is lower than the height of each of the axial-component support walls 156a and 156b paired, as shown in FIG. 4(b). The height of the upper axial-component support wall 156a and the height of the lower axial-component support wall 156b are the same. Further, the height of the axial-component stop wall 156c of the first support component 151 is lower than the height of an axial-component stop wall 166c of the second support component 152 as described below.

Further, the first support component 151 includes a stopper 157 used for holding the first auxiliary axial-component 141 in the recess 156. The stopper 157 includes an operation component 157a operated by a user, and a rod component 157b integrated with the operation component 157a, as shown in FIG. 4(b).

The operation component 157a has a plate-like shape having a rounded upper front side portion. The operation component 157a is provided in a mounting space 158 formed in the first support component 151. The mounting space 158 is adjacent to the recess 156 via a separation wall 159. The mounting space 158 has an opening at the front surface of the first support component 151. Through the opening, the operation component 157a slightly projects.

On the other hand, the rod component 157b has a rod-like shape having a roughly rectangular cross-section. The rod component 157b is inserted into a through hole 159a formed in the separation wall 159. The rod component 157b has one end connected to a surface, on the separation wall 159 side, of the operation component 157a.

When the stopper 157 is slid in the axial direction of the rod component 157b by a user, switching is performed between a projecting state in which the rod component 157b projects from the bottom surface of the recess 156 to prevent the first auxiliary axial-component 141 from passing through the open side portion of the recess 156, and a non-projecting state in which the rod component 157b does not project from the bottom surface of the recess 156. The through hole 159a formed in the separation wall 159 is positioned so as to accommodate the first auxiliary axial-component 141 between the rod component 157b and the axial-component stop wall 156c in the projecting state. Therefore, the non-projecting state can be switched to the projecting state in a state where the first auxiliary axial-component 141 abuts against the axial-component stop wall 156c. In the projecting state, the first auxiliary axial-component 141 is held in the recess 156 by the stopper 157. When the projecting state is switched to the non-projecting state, a state where the first auxiliary axial-component 141 is held in the recess 156 by the stopper 157 is cancelled, and the first auxiliary axial-component 141 is allowed to pass through the open side portion of the recess 156.

The second support component 152 is provided on the other corner portion (the left far side corner portion in FIG. 1) on the far side of the top surface 101a of the first casing 101. The second support component 152 is provided in the first casing 101 on the side opposite to the first support component 151 side so as to sandwich the hinge mechanism 120. The second support component 152 is a small projection having a rounded top portion as shown in FIG. 5. The second support component 152 projects from the top surface 101a of the first casing 101. The second support component 152 is formed as a second axial-component receiving section having formed therein a recess 166 into which the first auxiliary axial-component 141 fits in the inversely opened position. Further, the second support component 152 forms a part of a movable component 181 described below.

As shown in FIG. 5(c), the second support component 152 has the recess 166 formed, in almost a U-shape, on the inner surface 152a that is opposed to the outer side surface 122a of the second projecting case component 122 in the normally opened position. In the second support component 152, the recess 166 is open on the front side thereof. The recess 166 includes an upper axial-component support wall 166a, a lower axial-component support wall 166b, and a rear side axial-component stop wall 166c. The upper axial-component support wall 166a, the lower axial-component support wall 166b, and the rear side axial-component stop wall 166c extend almost perpendicular to the bottom surface of the recess 166 through a haunch. In the second support component 152, the axial-component stop wall 166c prevents passing of the first auxiliary axial-component 141. The height (the height from the bottom surface of the recess 166 to the top end of the axial-component stop wall 166c) of the axial-component stop wall 166c is the same as the height of each of the upper axial-component support wall 166a and the lower axial-component support wall 166b as shown in FIG. 5(b).

[1-3. Function, Effect, and the Like of Support Assisting Section]

A function, an effect, and the like of the support assisting section 150 in opening and closing the electronic device 100 will be described.

Firstly, an exemplary case where the support assisting section 150 is not included in the electronic device 100 is assumed and described for comparison with the present embodiment. The second casing 102 is supported by the first casing 101 via the hinge mechanism 120. The hinge mechanism 120 is connected to the center portion, on the base end side, of the second casing 102. Therefore, in a case where the electronic device 100 is in the normally opened position or the inversely opened position, unless the support assisting section 150 is provided, the second casing 102 is likely to pivot about the hinge mechanism 120 and tilt leftward or rightward. If the second casing 102 tilts leftward or rightward, a relatively heavy load may be applied to the hinge mechanism 120.

On the other hand, in the present embodiment, the first auxiliary axial-component 141 having an amount of projection unchanged, the first support component 151 having formed therein the recess 156 into which the first auxiliary axial-component 141 fits in the normally opened position, and the second support component 152 having formed therein the recess 166 into which the first auxiliary axial-component 141 fits in the inversely opened position, are provided. In a state where the first auxiliary axial-component 141 fits into the recess 156 (or the recess 166), the first auxiliary axial-component 141 abuts against the upper axial-component support wall 156a (or the upper axial-component support wall 166a), and the first auxiliary axial-component 141 abuts against the lower axial-component support wall 156b (or the lower axial-component support wall 166b). A small gap may be formed between the first auxiliary axial-component 141 and the upper axial-component support wall 156a (or the upper axial-component support wall 166a), and a small gap may be formed between the first auxiliary axial-component 141 and the lower axial-component support wall 156b (or the lower axial-component support wall 166b).

Therefore, in the normally opened position, the lower axial-component support wall 156b of the first support component 151 abuts against the first auxiliary axial-component 141 to prevent the second casing 102 from pivoting about the hinge mechanism 120 and tilting rightward in FIG. 1, and the upper axial-component support wall 156a of the first support component 151 abuts against the first auxiliary axial-component 141 to prevent the second casing 102 from pivoting about the hinge mechanism 120 and tilting leftward in FIG. 1. The first auxiliary axial-component 141 is supported by the wall surfaces of the recess 156 of the first support component 151. "Tilting the second casing 102 leftward (or rightward)" represents "titling the second casing 102 so as to be lowered leftward (or rightward)".

On the other hand, in the inversely opened position, the upper axial-component support wall 166a of the second support component 152 abuts against the first auxiliary axial-component 141 to prevent the second casing 102 from pivoting about the hinge mechanism 120 and tilting rightward, and the lower axial-component support wall 166b of the second support component 152 abuts against the first auxiliary axial-component 141 to prevent the second casing 102 from pivoting about the hinge mechanism 120 and tilting leftward. The first auxiliary axial-component 141 is supported by the wall surfaces of the recess 166 of the second support component 152.

Further, in the present embodiment, the second auxiliary axial-component 142 is also provided. The second auxiliary axial-component 142 is formed as a projection component that fits into the recess 166 of the second support component 152 in the normally opened position, and fits into the recess 156 of the first support component 151 in the inversely opened position. Therefore, in the normally opened position, the upper axial-component support wall 166a and the lower axial-component support wall 166b of the second support component 152 abut against the second auxiliary axial-component 142 to prevent the second casing 102 from pivoting about the hinge mechanism 120 and tilting leftward and rightward. On the other hand, in the inversely opened position, the upper axial-component support wall 156a and the lower axial-component support wall 156b of the first support component 151 abut against the second auxiliary axial-component 142 to prevent the second casing 102 from pivoting about the hinge mechanism 120 and tilting leftward and rightward.

As described above, according to the present embodiment, the support assisting section 150 assists in supporting the second casing 102 when the electronic device 100 is opened and closed, and the second casing 102 can be supported at three sections, that is, the hinge mechanism 120, the first support component 151, and the second support component 152. Therefore, the second casing 102 can be restrained from tilting leftward and rightward when the electronic device 100 is opened and closed.

Further, when the stopper 157 is put into the projecting state in the normally opened position, the rotation of the second casing 102 about the inverting axial-component 128 can be inhibited. Therefore, the second casing 102 can be stably supported when the normally opened position is switched to the normally closed position.

Figure 6:
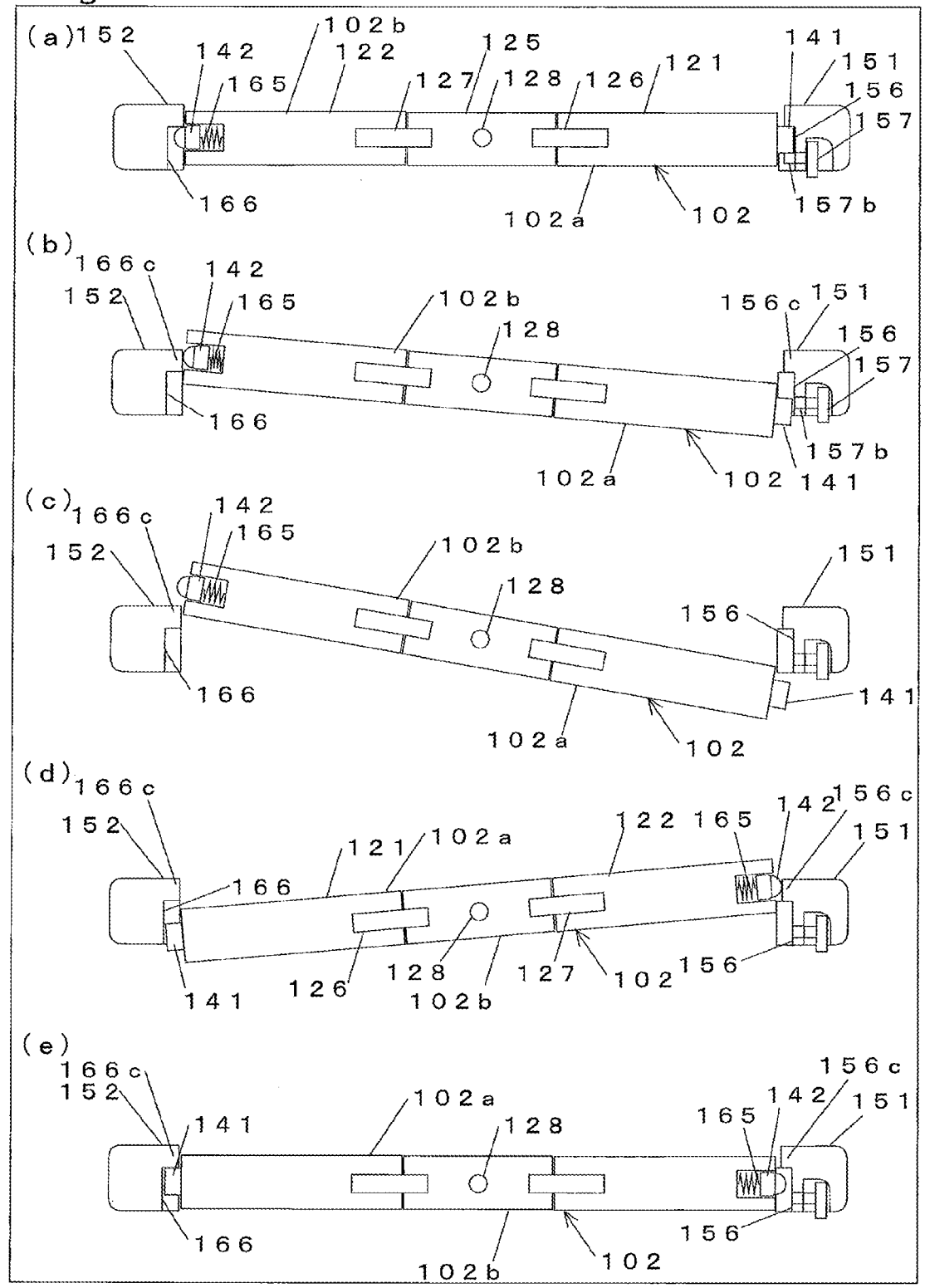
FIG. 6 is a cross-sectional view of a base end portion of the second casing, illustrating a function of a support assisting section exhibited when the second casing is rotated about the inverting axial-component in the electronic device according to the first embodiment.

Subsequently, the function, the effect, and the like of the support assisting section 150 in rotating the second casing 102 about the inverting axial-component 128 will be described. FIG. 6 is a cross-sectional view of the base end portion of the second casing 102, illustrating a function of the support assisting section 150 exhibited when the second casing 102 is rotated about the inverting axial-component 128. FIG. 6(a) is a cross-sectional view illustrating the normally opened position, FIG. 6(b) is a cross-sectional view illustrating a state where the second casing 102 is rotated clockwise by five degrees from the normally opened position, FIG. 6(c) is a cross-sectional view illustrating a state where the second casing 102 is rotated clockwise by ten degrees from the normally opened position, FIG. 6(d) is a cross-sectional view illustrating a state where the second casing 102 is rotated clockwise by 175 degrees from the normally opened position, and FIG. 6(e) is a cross-sectional view illustrating a state (that is, the inversely opened position) where the second casing 102 is rotated clockwise by 180 degrees from the normally opened position.

As shown in FIG. 6(a), the first auxiliary axial-component 141 fits into the recess 156 of the first support component 151, and the second auxiliary axial-component 142 fits into the recess 166 of the second support component 152, in the normally opened position. In FIG. 6(a), the stopper 157 is in the projecting state. If rotation of the second casing 102 about the inverting axial-component 128 is attempted, the first auxiliary axial-component 141 is caught by the rod component 157b of the stopper 157, and the second casing 102 cannot be rotated. When a user operates the stopper 157 so as to be put into the projecting state in the normally opened position, an unintended rotation of the second casing 102 can be prevented.

When the user switches the stopper 157 to the non-projecting state in the normally opened position, the second casing 102 is allowed to rotate. When the second casing 102 is rotated slightly from the normally opened position, the first auxiliary axial-component 141 passes through the open side portion of the recess 156 of the first support component 151 as shown in FIG. 6(b). On the other hand, the top portion 142a of the second auxiliary axial-component 142 abuts against and is pushed by the axial-component stop wall 166c of the second support component 152. As a result, the elastic component 165 is contracted, and an amount of projection of the second auxiliary axial-component 142 is reduced. Thus, the second auxiliary axial-component 142 is allowed to pass by the axial-component stop wall 166c. When the second auxiliary axial-component 142 has passed by the axial-component stop wall 166c, the elastic component 165 is extended and an amount of projection of the second auxiliary axial-component 142 is restored as shown in FIG. 6(c). Thus, the second auxiliary axial-component 142 is disengaged from the recess 166 of the second support component 152.

As shown in FIG. 6(d), since the recess 166 of the second support component 152 is open on the front side, the first auxiliary axial-component 141 passes through the open side portion of the recess 166 of the second support component 152, and fits into the recess 166. On the other hand, the top portion 142a of the second auxiliary axial-component 142 abuts against and is pushed by the axial-component stop wall 156c of the first support component 151 immediately before fitting into the recess 156 of the first support component 151. As a result, the elastic component 165 is contracted, and an amount of projection of the second auxiliary axial-component 142 is reduced. Thus, the second auxiliary axial-component 142 is allowed to pass by the axial-component stop wall 156c. When the second auxiliary axial-component 142 has passed by the axial-component stop wall 156c and fits into the recess 156, the elastic component 165 is extended, and an amount of projection of the second auxiliary axial-component 142 is restored as shown FIG. 6(e).

As described above, the second casing 102 can be rotated about the inverting axial-component 128 relative to the first casing 101, to move the first auxiliary axial-component 141 into or out of the recesses 156 and 166 through the open end portions of the recesses 156 and 166. Further, the second auxiliary axial-component 142 can be caused to pass by the axial-component stop walls 156c and 166c with an amount of projection of the second auxiliary axial-component 142 being changed, thereby enabling the second auxiliary axial-component 142 to move into or out of the recesses 156 and 166.

Further, since the first auxiliary axial-component 141 is fixed to the second casing 102, an amount of projection of the first auxiliary axial-component 141 is constant. Therefore, the first auxiliary axial-component 141 can be supported by the first support component 151 with enhanced stability in the normally opened position, and the first auxiliary axial-component 141 can be supported by the second support component 152 with enhanced stability in the inversely opened position.

Further, since an amount of projection of the second auxiliary axial-component 142 is changed by means of the elastic component 165, the second auxiliary axial-component 142 can be smoothly moved into or out of the recesses 156 and 166 regardless of the support components 151 and 152 having provided therein the axial-component stop walls 156c and 166c for preventing passing of the first auxiliary axial-component 141. In the present embodiment, since the top portion 142a of the second auxiliary axial-component 142, which is rounded, abuts against the axial-component stop walls 156c and 166c, the second auxiliary axial-component 142 can be smoothly moved into or out of the recesses 156 and 166. Further, in the first support component 151, since the height of the axial-component stop wall 156c is lower than the height of each of the axial-component support walls 156a and 156b, the second auxiliary axial-component 142 can be smoothly moved into or out of the recess 156.

Further, when the second auxiliary axial-component 142 fits into the recess 156 or 166, a user can feel that an amount of the projection of the second auxiliary axial-component 142 is restored, and the user can recognize that the switching between the normally opened position and the inversely opened position has been ended. In particular, the height of the axial-component stop wall 156c of the first support component 151 is lower than the height of the axial-component stop wall 166c of the second support component 152. Therefore, the user can experience a different feeling between the switching to the normally opened position and the switching to the inversely opened position.

Further, in the support components 151 and 152, among the front side portion and the rear side portion of each of the recesses 156 and 166, the portion through which the first auxiliary axial-component 141 passes when the second casing 102 is rotated in a direction in which the rotation is allowed, is opened, and the axial-component stop walls 156c and 166c are formed on the sides opposite to the open sides. Therefore, the second casing 102 can be prevented from rotating beyond a rotation range of the second casing 102 which is set for the hinge mechanism 120.

[1-4. Structure of Movable Support Section]

The electronic device 100 further includes a movable support section 170 for supporting the second support component 152 so as to be movable relative to the first casing 101 such that, when the second support component 152 is pushed by the display 103, an amount of projection of the second support component 152 from the top surface 101a of the first casing 101 is reduced, as shown in FIG. 5(c). The second support component 152 is positioned, on the top surface 101a of the first casing 101, at such a position as to abut against the display 103 only when the electronic device 100 is closed in the course of switching between the normally opened position and the inversely opened position. The second support component 152 supports not the opening and closing axial-components 126 and 127 of the hinge mechanism 120, but the first auxiliary axial-component 141 and the second auxiliary axial-component 142 as an axial-component for opening and closing the electronic device 100, as described above. The opening and closing axial-components 126 and 127 act as a main axial-component, and the first auxiliary axial-component 141 and the second auxiliary axial-component 142 act as an auxiliary axial-component.

Figure 7:
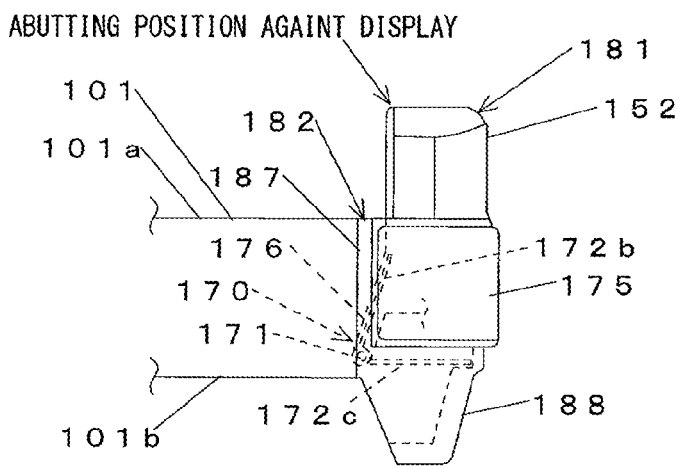
FIG. 7 illustrates the second support component of the electronic device according to the first embodiment, as viewed from a rear side of a first casing.
Figure 8:
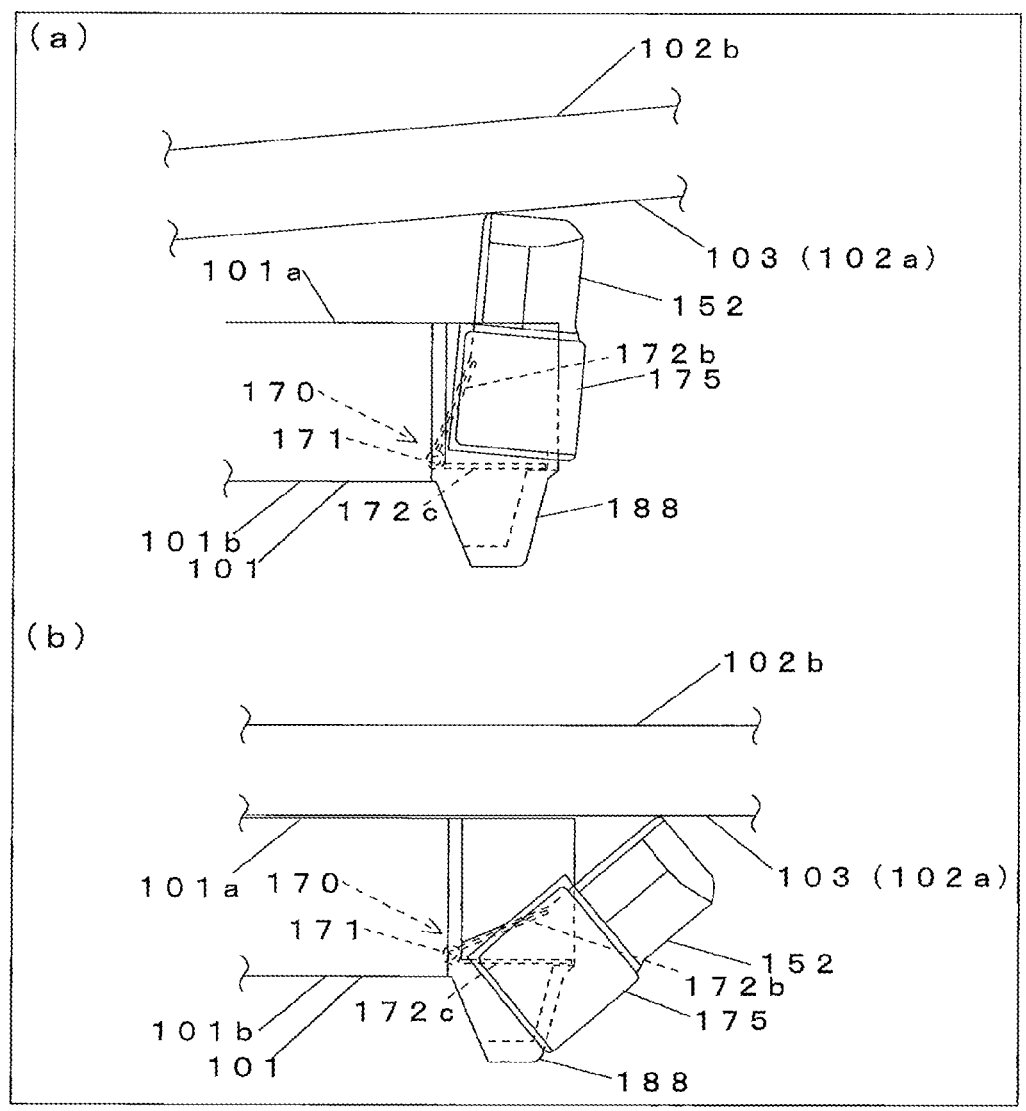
FIG. 8 illustrates a state where the second support component of the electronic device according to the first embodiment is titled, as viewed from the rear side of the first casing.

FIG. 7 illustrates the second support component 152 of the electronic device 100 of the present embodiment, as viewed from the rear side of the first casing 101. FIG. 8 illustrates a state where the second support component 152 of the electronic device 100 according to the present embodiment is tilted, as viewed from the rear side of the first casing 101.

As shown in FIG. 5(c), the movable support section 170 includes: a support axial-component 171 for rotating the second support component 152 relative to the first casing 101; an axial-component receiving section 174 for supporting the support axial-component 171 provided in the first casing 101, so as to allow the support axial-component 171 to rotate; and an elastic component 172 for restoring a position of the second support component 152 which has been pushed by the display 103 and pivoted about the support axial-component 171.

The support axial-component 171 is formed in a circular cylindrical shape. The support axial-component 171 extends in the front-rear direction of the first casing 101. As shown in FIG. 7, a pivot of the support axial-component 171 is positioned, in the first casing 101, inward of a position in the second support component 152 at which the second support component 152 abuts against the display 103, in the left-right direction of the first casing 101. Further, the pivot of the support axial-component 171 is below a lower end of a corner component 175 described below, in the up-down direction of the first casing 101.

On the other hand, the elastic component 172 is implemented as a torsion spring. The elastic component 172 includes: a coil section 172a, formed as a coil-like component, through which the support axial-component 171 penetrates; a first rod section 172b that extends from one end of the coil section 172a in almost a tangential direction; and a second rod section 172c that extends from the other end of the coil section 172a in almost a tangential direction, as shown in FIG. 5(c). In the elastic component 172 in the state shown in FIG. 7 (a state where the second support component 152 is not tilted), in a state where the coil section 172a is supported by the support axial-component 171, the first rod section 172b is pushed by a connection component 176 described below, and the second rod section 172c is pushed by a bottom surface of a fitting groove 188a of a leg section 188.

The second support component 152 forms a part of the movable component 181 that is supported so as to be movable relative to the first casing 101. The movable component 181 is supported so as to be movable relative to the first casing 101 through a fixed component 182 fixed to the first casing 101.

As shown in FIG. 7, the movable component 181 is a component in which the second support component 152, the corner component 175 provided below the second support component 152, and the connection component 176 for connecting to the fixed component 182 are integrated with each other. The corner component 175 is integrated with the lower end of the second support component 152. Further, the connection component 176 is integrated with an inner surface of the corner component 175. The connection component 176 extends diagonally downward from the inner surface of the corner component 175. The first rod section 172*b* of the elastic component 172 is fixed to an inner surface of the connection component 176. A through hole 176*a* into which the support axial-component 171 is inserted is formed at an end portion of the connection component 176, as shown in FIG. 5(*c*). Both ends of the support axial-component 171 which is inserted into the through hole 176*a* are fitted into the axial-component receiving section 174 of the fixed component 182, thereby connecting the movable component 181 to the fixed component 182.

On the other hand, the fixed component 182 includes: a body section 187 which is roughly L-shaped as viewed in a planar manner: and the leg section 188 integrated with a lower portion of the body section 187. As shown in FIG. 5(*b*), a cut portion 185 is formed at a corner portion (the left far side corner portion in FIG. 1), on the far side, of the first casing 101. The fixed component 182 is fixed to the first casing 101 by means of screws and the like in a state where the body section 187 is fitted into the cut portion 185. In this state, a cut portion 186 into which the movable component 181 is fitted is formed outside the body section 187 which is almost L-shaped as viewed in a planar manner.

As shown in FIG. 5(*c*), the body section 187 has formed therein the axial-component receiving section 174 for supporting the support axial-component 171 so as to allow the support axial-component 171 to rotate. The axial-component receiving section 174 includes: a first axial-component receiving section 174*a* formed in an inner surface of a portion, in the body section 187, forming a part of the rear side end face 101*d* of the first casing 101; and a second-axial-component receiving section 174*b* opposed to the first axial-component receiving section 174*a*. The first axial-component receiving section 174*a* and the second axial-component receiving section 174*b* are opposed to each other in the front-rear direction of the first casing 101.

The leg section 188 projects from the back surface 101*b* of the electronic device 100 as shown in FIG. 5(*c*). On the upper end in the inner surface of the leg section 188, the fitting groove 188*a* into which the second rod section 172*c* of the elastic component 172 is fitted, is formed. The second rod section 172*c* is supported by the bottom surface of the fitting groove 188*a*. On the far side of the first casing 101, the leg section 188 is also provided at a position opposite to the first support component 151 on the side reverse of the first support component 151 side (the right far side corner portion in FIG. 1) (not shown).

[1-5. Function, Effect, and the Like of Movable Support Section]

In the movable support section 170, the support axial-component 171 is provided along the front-rear direction of the first casing 101. The support axial-component 171 is supported by a pair of the first axial-component receiving section 174*a* and the second axial-component receiving section 174*b*, so as to be rotatable. In this state, in a case where the electronic device 100 is closed in the course of switching between the normally opened position and the inversely opened position as shown in FIG. 2, the display 103 on the front surface 102*a* of the second casing 102 abuts against the top end of the second support component 152. When the second support component 152 is pushed downward by the display 103, the second support component 152 pivots about the support axial-component 171 to rotate outward of the first casing 101, and the second support component 152 is tilted outward of the first casing 101, as shown in FIG. 8(*a*).

When the second casing 102 is further tilted from the position shown in FIG. 8(*a*) so as to approach the first casing 101, the second support component 152 is further pushed, and the second support component 152 is further rotated by pivoting about the support axial-component 171. The second support component 152 can pivot about the support axial-component 171 to rotate to a limit position at which the lower end of the corner component 175 abuts against the outer surface of the leg component 188, as shown in FIG. 8(*b*). The top end portion of the second support component 152 having been rotated to the limit position is almost level with the top surface 101*a* of the first casing 101. In the present embodiment, an amount of projection of the second support component 152 continues to be successively reduced until the front surface 102*a* of the second casing 102 abuts against the top surface 101*a* of the first casing 101.

According to the present embodiment, even if the second support component 152 abuts against the display 103 in a case where the electronic device 100 is closed in the course of switching between the normally opened position and the inversely opened position, an amount of projection of the second support component 152 is reduced. Therefore, an external force applied from the second support component 152 to the display 103 can be reduced.

In a case where, as in the present embodiment, a direction in which the second casing 102 rotates relative to the first casing 101 is uniquely set, a portion against which the display 103 is likely to abut in the course of switching between the normally opened position and the inversely opened position, is limited. In such a case, even in a case where components that project from the top surface 101*a* of the first casing 101 function in conjunction with each other, only the component against which the display 103 is likely to abut may be movable so as to reduce an amount of projection. Specifically, in the present embodiment, although the display 103 is likely to abut against the second support component 152 in the course of switching between the normally opened position and the inversely opened position, the display 103 may not abut against the first support component 151. This is because the first auxiliary axial-component 141 is restrained from moving in the far side direction, by means of the wall surface of the recess 156. Therefore, in the present embodiment, the first support component 151 is fixed to the first casing 101 so as not to be movable. Also in this case, when the display 103 faces the far side, the back surface 102*b* of the display 103 may abut against the first support component 151 by the display 103 being titled toward the near side. However, in general, the display 103 is more fragile than the back surface 102*b*, and it is significant to protect the display 103 as an electronic component. On the other hand, the back surface 102*b* is likely to be hard and resistant to the abutment of the first support component 151.

Further, the second support component 152 rotates outward of the first casing 101 by pivoting about the support axial-component 171. The pivot of the support axial-component 171 is positioned, in the first casing 101, inward of a position in the second support component 152 at which the second support component 152 abuts against the display 103.

Therefore, the second support component 152 can be smoothly rotated outward of the first casing 101 due to a load applied from the display 103 to the second support component 152.

Further, when the display 103 is moved away from the second support component 152, the second support component 152 is returned, due to a restoring force of the elastic component 172, to a non-pushed position in which the second support component 152 is not pushed by the display 103. Therefore, a user is allowed to omit an operation for returning the second support component 152 to the non-pushed position.

[1-6. Summary of the First Embodiment]

In the present embodiment, the movable support section 170 is provided which supports the second support component 152 so as to be movable relative to the first casing 101 such that an amount of projection of the second support component 152 from the top surface 101a of the first casing 101 is reduced when the second support component 152 (projecting component) is pushed by the display 103 in a case where the electronic device 100 is closed. Therefore, an amount of projection of the second support component 152 is reduced according to the display 103 being tilted after the display 103 has abutted against the second support component 152. Therefore, an external force applied from the second support component 152 to the display 103 can be reduced as compared to in a case where an amount of projection of the second support component 152 is not changed.

Further, in the present embodiment, the second support component 152 is positioned on the top surface 101a of the first casing 101, at such a position as to abut against the display 103 in a case where the electronic device 100 is closed in the course of switching between the normally opened position and the inversely opened position. Therefore, even if the electronic device 100 is unintentionally closed in the course of switching between the normally opened position and the inversely opened position, application of a great external force from the second support component 152 to the display 103 can be prevented.

Furthermore, in the present embodiment, the second support component 152 supports the axial-components 141 and 142 used when the electronic device 100 is opened and closed, so as to allow the axial-components 141 and 142 to rotate. Therefore, with application of a great external force from the second support component 152 to the display 103 being prevented, the electronic device 100 can be stably opened and closed by means of the second support component 152.

Moreover, in the present embodiment, the hinge mechanism 120 has the opening and closing axial-components 126 and 127 (main axial-component) used when the electronic device 100 is opened and closed. In the second casing 102 and the second support component 152, the second casing 102 includes the auxiliary axial-components 141 and 142 (auxiliary axial-component) that are positioned on an extended line of the opening and closing axial-components 126 and 127 in the normally opened position and that are used when the electronic device 100 is opened and closed, and the second support component 152 supports the auxiliary axial-component so as to allow the auxiliary axial-component to rotate when the electronic device 100 is opened and closed. For opening and closing the electronic device 100, not only the opening and closing axial-components 126 and 127 of the hinge mechanism 120, but also the auxiliary axial-components 141 and 142 are used. The auxiliary axial-components 141 and 142 are supported by the second support component 152 so as to be rotatable. Therefore, the electronic device 100 can be stably opened and closed as compared to in a case where the electronic device 100 is opened and closed simply by means of the opening and closing axial-components 126 and 127.

Furthermore, in the present embodiment, the hinge mechanism 120 connects the rear side portion of the first casing 101 to the second casing 102. The second support component 152 is provided at the corner portion, on the rear side, of the first casing 101. The movable support section 170 pivots about the support axial-component 171 that is rotatably supported by the first casing 101, and that extends in the front-rear direction of the first casing 101, and supports the second support component 152 so as to allow the second support component 152 to rotate outward of the first casing 101. The second support component 152 pivots about the support axial-component 171 to rotate outward of the first casing 101. In the present embodiment, since the second support component 152 is provided at the corner portion, on the rear side, of the first casing 101, a force with which the display 103 pushes the second support component 152 in the case of the display 103 abutting against the second support component 152, contains components in the left-right direction orthogonal to the front-rear direction of the first casing 101. Therefore, the second support component 152 can be smoothly rotated outward of the first casing 101.

Further, in the present embodiment, the pivot of the support axial-component 171 is positioned, in the first casing 101, inward of a position in the second support component 152 at which the second support component 152 abuts against the display 103. Therefore, the second support component 152 can be smoothly rotated outward of the first casing 101 due to a load applied from the display 103 to the second support component 152.

Further, in the present embodiment, the movable support section 170 includes the elastic component 172 for restoring a position of the second support component 152 which has been pushed by the display 103 and moved. Therefore, when the display 103 is moved away from the second support component 152, the second support component 152 is returned to a non-pushed position in which the second support component 152 is not pushed by the display 103, due to a restoring force of the elastic component 172. Therefore, a user is allowed to omit an operation of returning the second support component 152 to the non-pushed position.

Further, in the present embodiment, the first casing 101 includes the leg component 188 that projects from the back surface 101b of the first casing 101 at an opposite position on a side reverse of the second support component 152 side. The second support component 152 is integrated with the corner component 175 that forms the corner portion of the outer circumferential surface of the first casing 101. The second support component 152 can pivot about the support axial-component 171 to rotate to a limit position at which the lower end of the corner component 175 abuts against the outer surface of the leg component 188. The top end portion of the second support component 152 which has been rotated to the limit position is almost level with the top surface 101a of the first casing 101. In the present embodiment, with the leg component 188 being provided, an amount of projection of the second support component 152 can be sufficiently reduced.

Further, in the present embodiment, the second casing 102 is provided with the first auxiliary axial-component 141 (auxiliary axial-component), and the second support component 152 supports, in the inversely opened position, the first auxiliary axial-component 141 so as to allow the first auxiliary axial-component 141 to rotate. The first support component 151 (axial-component receiving section) for supporting, in the normally opened position, the first auxiliary axial-component 141 so as to allow the first auxiliary axial-component 141 to rotate, is fixed to the first casing 101. The hinge mechanism 120 is structured such that the second casing 102 can be rotated relative to the first casing 101 only in the first rotation direction that causes the display 103 to face the second support component 152 in the course of the normally opened position being switched to the inversely opened position, and the second casing 102 can be rotated relative to the first casing 101 only in the second rotation direction opposite to the first rotation direction in the course of the inversely opened position being switched to the normally opened position. In the present embodiment, in the course of switching between the normally opened position and the inversely opened position, the display 103 does not face the first support component 151, and the first support component 151 that does not abut against the display 103 is fixed to the first casing 101. Therefore, in the normally opened position, the auxiliary axial-component 141 can be stably supported by the first support component 151.

Second Embodiment

Hereinafter, a second embodiment will be described with reference to FIG. 9 and FIG. 10. The second embodiment is different from the first embodiment in shape of the recess 156 of the first support component 151 and shape of the recess 166 of the second support component 152. In the second embodiment, the shape of the recess 156 of the first support component 151 and the shape of the recess 166 of the second support component 152 are the same. Hereinafter, the recess 156 of the first support component 151 will be described. Similarly to the first embodiment, the first support component 151 is fixed to the first casing 101, and the second support component 152 is supported so as to be movable relative to the first casing 101, by the movable support section 170.

Further, the second embodiment is different from the first embodiment in shape of a fitting section 240 of the first auxiliary axial-component 141 which fits into the recesses 156 and 166 and shape of a fitting section of the second auxiliary axial-component 142 which fits into the recesses 156 and 166. In the second embodiment, the shape of the fitting section 240 of the first auxiliary axial-component 141 and the shape of the fitting section of the second auxiliary axial-component 142 are the same. Hereinafter, the shape of the fitting section 240 of the first auxiliary axial-component 141 will be described.

Figure 9:
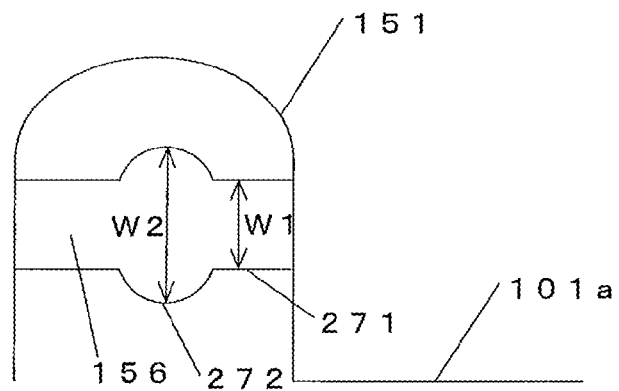
FIG. 9 is a front view of an inner surface of a first support component of the electronic device according to a second embodiment.
Figure 10:
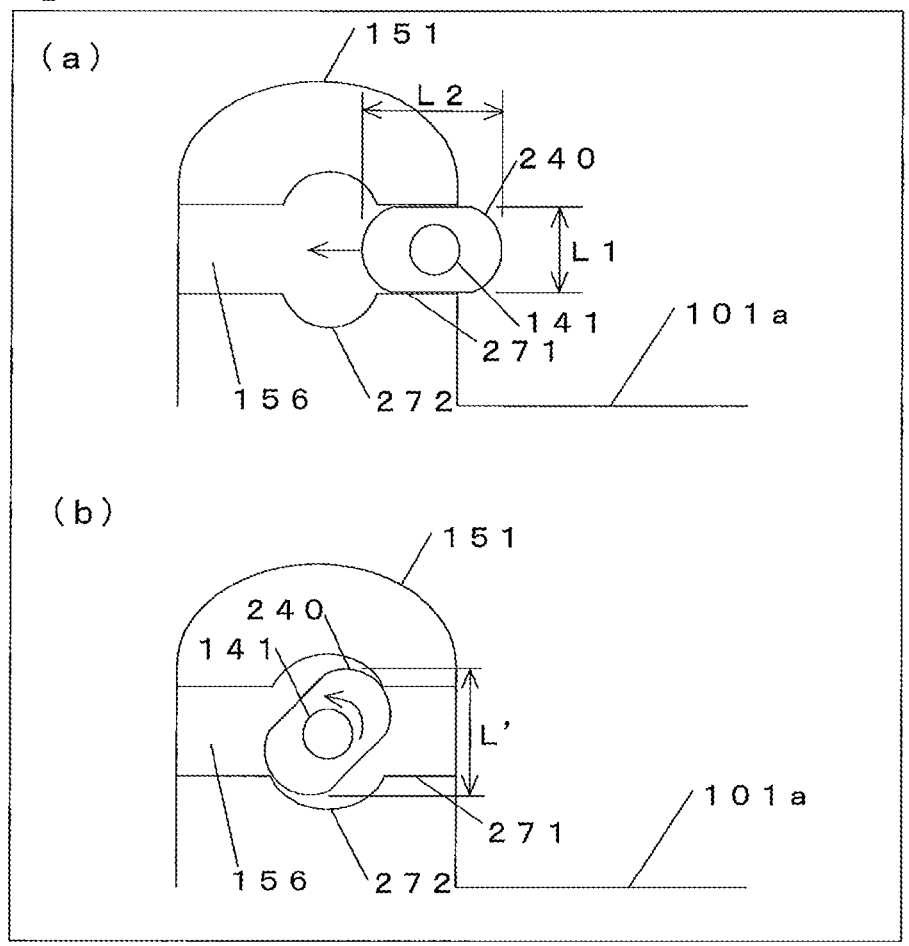
FIG. 10 illustrates a state where a first auxiliary axial-component is moved into or out of the first support component of the electronic device according to the second embodiment.

FIG. 9 is a front view of an inner surface of the first support component 151 of the electronic device according to the present embodiment. FIG. 10 illustrates a state where the first auxiliary axial-component 141 is moved into or out of the first support component 151 of the electronic device 100 according to the present embodiment.

As shown in FIG. 9, the recess 156 of the first support component 151 is formed as a groove that extends in the front-rear direction from an inlet/outlet through which the first auxiliary axial-component 141 is moved into or out of the recess 156. The first support component 151 has formed therein a reduced-width section 271 in which the recess 156 has a narrow groove width, and an increased-width section 272 that is positioned in the recess 156 inward of the reduced-width section 271 and that has a groove width of the recess 156 increased as compared to the reduced-width section 271. The increased-width section 272 is formed by side walls of the recess 156 being each cut at almost the center portion thereof so as to be roughly D-shaped. In the first support component 151, the recess 156 is open on both the front side and the rear side thereof. As shown in FIG. 10(a), the fitting section 240 of the first auxiliary axial-component 141 which fits into the recess 156 has a cross-sectional shape of which the length in the width direction of the recess 156 is changed when the first auxiliary axial-component 141 is rotated about its axial center. Specifically, the fitting section 240 has a roughly elliptical cross-sectional shape. In the fitting section 240, a length L1, in a first direction, which passes through the axial center of the first auxiliary axial-component 141 is smaller than a groove width W1 of the reduced-width section 271, and a length L2, in a second direction orthogonal to the first direction, which passes through the axial center of the first auxiliary axial-component 141 is greater than the groove width W1 of the reduced-width section 271, and is smaller than a groove width W2 of the increased-width section 272.

As shown in FIG. 10(a), when the first auxiliary axial-component 141 is moved into or out of the recess 156, an orientation of the fitting section 240 is set such that the second direction of the fitting section 240 is the same as a direction (the front-rear direction of the first casing 101) in which the recess 156 extends. As a result, the fitting section 240 is put into a passing-allowed state in which the length L1 in the width direction of the recess 156 is smaller than the groove width W1 of the reduced-width section 271, and the fitting section 240 passes through the reduced-width section 271 of the recess 156. As shown in FIG. 10(b), when the second casing 102 pivots about the opening and closing axial-components 126 and 127 in a state where the fitting section 240 is positioned in the increased-width section 272 of the recess 156, the first auxiliary axial-component 141 is rotated to rotate the fitting section 240 in the increased-width section 272. As a result, the fitting section 240 is put into a passing-unallowed state in which a length L' in the width direction of the recess 156 is greater than the groove width W1 of the reduced-width section 271, and is smaller than the groove width W2 of the increased-width section 272. Thus, the fitting section 240 is held in the increased-width section 272.

In the present embodiment, a structure of the support assisting section 150 for assisting the hinge mechanism 120 in supporting the second casing 102 can be simplified. Further, since the fitting section 240 is held in the increased-width section 272 of the recess 156, the first auxiliary axial-component 141 can be stably held.

Although, in the present embodiment, the first auxiliary axial-component 141 rotates in conjunction with the second casing 102 pivoting about the opening and closing axial-components 126 and 127, a mechanism may be provided for automatically rotating the first auxiliary axial-component 141 when the first auxiliary axial-component 141 reaches the increased-width section 272.

[Summary of the Second Embodiment]

In the present embodiment, the movable support section 170 is provided which supports the second support component 152 so as to be movable relative to the first casing 101 such that an amount of projection of the second support component 152 from the top surface 101a of the first casing 101 is reduced when the second support component 152 (projecting component) is pushed by the display 103 in the case of the electronic device 100 being closed. Therefore, an external force applied from the second support component 152 to the display 103 can be reduced as compared to in a case where an amount of projection of the second support component 152 is not changed.

Other Embodiments

As described above, the first and the second embodiments have been descried above as examples of the technology disclosed in the present application. However, the technology according to the present disclosure is not limited to these embodiments, and is also applicable to other embodiments realized by modifications, replacements, additions, and omissions as appropriate. Furthermore, another embodiment can be realized by combining the components described in the first and the second embodiments.

Hereinafter, other exemplary embodiments will be described.

In the first and the second embodiments, a notebook computer is described as an example of the electronic device 100. However, the electronic device 100 may be, for example, foldable mobile telephone terminals, foldable electronic game machines, and foldable electronic dictionary terminals. The electronic device may be a device that includes the hinge mechanism 120 having the opening and closing axial-component.

Further, although, in the first and the second embodiments, the movable support section 170 supports the second support component 152 so as to allow the second support component 152 to rotate outward of the first casing 101, the second support component 152 may be supported so as to be movable in the thickness direction of the first casing 101.

Furthermore, although, in the first and the second embodiments, the movable support section 170 includes the elastic component 172 for restoring a position of the second support component 152 which has been pushed by the display 103 and moved, the movable support section 170 may not include the elastic component 172. When the movable support section 170 does not include the elastic component 172, a position of the second support component 152 which has been pushed by the display 103 and moved is restored by a user.

Further, although, in the first and the second embodiments, the second support component 152 is supported by the movable support section 170 so as to be movable, another projecting component positioned at such a position as to abut against the display 103 in a case where the electronic device 100 is closed, may be supported so as to be movable such that an amount of projection of the projecting component from the top surface 101a of the first casing 101 is reduced when the projecting component is pushed by the display 103. Such a projecting component may be a component (for example, a track pointer used for moving a pointer (for example, an arrow) on a screen) that projects in a region, on the top surface 101a of the first casing 101, in which a keyboard is provided. In this case, the hinge mechanism 120 may be structured such that the second casing 102 cannot rotate relative to the first casing 101 in a state where the electronic device 100 is opened. Further, in a case where the second casing 102 can be rotated, in the normally opened position, counterclockwise as viewed from above the electronic device 100, the first support component 151 may be supported, as such a projecting component, so as to be movable.

Further, although, in the first and the second embodiments, the first support component 151 and the second support component 152 are provided in the first casing 101 and the first auxiliary axial-component 141 and the second auxiliary axial-component 142 are provided in the second casing 102, the first support component 151 and the second support component 152 may be provided in the second casing 102 and the first auxiliary axial-component 141 and the second auxiliary axial-component 142 may be provided in the first casing 101. In this case, for example, the first auxiliary axial-component 141 or the second auxiliary axial-component 142 projects toward the inner side from an inner surface of a projecting component that projects from the corner portion, on the far side, of the first casing 101. On the outer side surfaces 121a and 122a of the projecting case components 121 and 122 of the second casing, recesses into which the first auxiliary axial-component 141 and the second auxiliary axial-component 142, respectively, fit are formed.

Furthermore, although, in the first and the second embodiments, the recesses 156 and 166 in the first support component 151 and the second support component 152, respectively, are each open only on the front side, each of the recesses 156 and 166 may be open on both the front side and the rear side. In this case, the second auxiliary axial-component 142 may be formed so as to have a flat top surface and a roughly circular-cylindrical shape, and may be fixed to the second projecting case component 122, similarly to the first auxiliary axial-component 141.

Further, although, in the first and the second embodiments, the first auxiliary axial-component 141 is formed in almost a circular cylindrical shape, the first auxiliary axial-component 141 may be formed in another shape (for example, a polygonal column).

Furthermore, in the first and the second embodiments, the second auxiliary axial-component 142 may function as an axial-component, and may be formed in a shape (for example, a spherical shape) other than a column-like shape.

As presented above, the embodiments have been described as an example of the technology according to the present disclosure. For this purpose, the accompanying drawings and the detailed description are provided.

Therefore, components in the accompanying drawings and the detailed description may include not only components essential for solving problems, but also components that are provided to illustrate the above described technology and are not essential for solving problems. Therefore, such inessential components should not be readily construed as being essential based on the fact that such inessential components are shown in the accompanying drawings or mentioned in the detailed description.

Further, the above described embodiments have been described to exemplify the technology according to the present disclosure, and therefore, various modifications, replacements, additions, and omissions may be made within the scope of the claims and the scope of the equivalents thereof.

What is claimed is:
1. An electronic device comprising:
   a first casing;
   a second casing connected to the first casing such that the electronic device is openable and closable, the second casing having a display provided on a surface on the first casing side;
   a projecting component that projects from a top side surface of the first casing, and is positioned on the top side surface of the first casing at such a position as to abut against the display when the electronic device is closed; and
   a movable support section configured to support the projecting component so as to allow the projecting component to move relative to the first casing such that an amount of projection of the projecting component from the top side surface of the first casing is reduced when the projecting component is pushed by the display in the case of the electronic device being closed,
   wherein the movable support section supports the protecting component so as to allow the projecting component to rotate outward of the first casing by pivoting about a support axial-component that is supported so as to be rotatable relative to the first casing.

2. The electronic device according to claim 1, further comprising
a rotation mechanism configured to connect the second casing to the first casing so as to allow the second casing to rotate relative to the first casing such that switching is performed between a normally opened position in which the display faces the first casing side and an inversely opened position in which the display faces a side opposite to the side which the display faces in the normally opened position, in a state where the electronic device is opened, wherein
the projecting component is positioned on the top side surface of the first casing at such a position as to abut against the display only when the electronic device is closed in the course of switching between the normally opened position and the inversely opened position.

3. The electronic device according to claim 1, wherein a pivot of the support axial-component is positioned, in the first casing, inward of a position in the projecting component at which the projecting component abuts against the display.

4. The electronic device according to claim 1, wherein the movable support section further includes an elastic component configured to restoring a position of the projecting component which has been pushed by the display and moved.

5. An electronic device comprising:
a first casing;
a second casing connected to the first casing such that the electronic device is openable and closable, the second casing having a display provided on a surface on the first casing side;
a projecting component that projects from a top side surface of the first casing, and is positioned on the top side surface of the first casing at such a position as to abut against the display when the electronic device is closed;
a movable support section configured to support the projecting component so as to allow the projecting component to move relative to the first casing such that an amount of projection of the projecting component from the top side surface of the first casing is reduced when the projecting component is pushed by the display in the case of the electronic device being closed; and
a rotation mechanism configured to connect the second casing to the first casing so as to allow the second casing to rotate relative to the first casing,
wherein the projecting component supports an axial-component used when the electronic device is opened and closed, so as to allow the axial-component to rotate.

6. An electronic device comprising:
a first casing;
a second casing connected to the first casing such that the electronic device is openable and closable, the second casing having a display provided on a surface on the first casing side;
a projecting component that projects from a top side surface of the first casing, and is positioned on the top side surface of the first casing at such a position as to abut against the display when the electronic device is closed;
a movable support section configured to support the projecting component so as to allow the projecting component to move relative to the first casing such that an amount of projection of the projecting component from the top side surface of the first casing is reduced when the projecting component is pushed by the display in the case of the electronic device being closed; and
a rotation mechanism configured to connect the second casing to the first casing so as to allow the second casing to rotate relative to the first casing,
wherein the rotation mechanism has a main axial-component used when the electronic device is opened and closed,
one of the second casing and the projecting component has an auxiliary axial-component that is positioned on an extended line of the main axial-component in the normally opened position and that is used when the electronic device is opened and closed, and
the other of the second casing and the projecting component supports the auxiliary axial-component so as to allow the auxiliary axial-component to rotate when the electronic device is opened and closed.

7. The electronic device according to claim 6, wherein
the rotation mechanism connects a rear side portion of the first casing to the second casing,
the projecting component is provided at a corner portion on a rear side of the first casing, and
the movable support section supports the projecting component so as to allow the projecting component to rotate outward of the first casing by pivoting about a support axial-component that is supported so as to be rotatable relative to the first casing and that extends in a front-rear direction of the first casing.

8. The electronic device according to claim 7, wherein a pivot of the support axial-component is positioned, in the first casing, inward of a position in the projecting component at which the projecting component abuts against the display.

9. The electronic device according to claim 7, wherein
the first casing includes a leg component that projects from a back surface of the first casing at a position reverse of a position of the projecting component,
the projecting component is integrated with a corner component that forms a corner portion of an outer circumferential surface of the first casing, and
the projecting component is rotatable to a limit position at which a lower end of the corner component abuts against an outer surface of the leg component, by pivoting about the support axial-component, and
a top end portion of the projecting component which has been rotated to the limit position is almost level with the top side surface of the first casing.

10. The electronic device according to claim 6, wherein
the auxiliary axial-component is provided in the second casing,
the projecting component supports the auxiliary axial-component so as to allow the auxiliary axial-component to rotate, in the inversely opened position,
an axial-component receiving section configured to support the auxiliary axial-component so as to allow the auxiliary axial-component to rotate, in the normally opened position, is fixed to the first casing, and
the rotation mechanism is structured such that the second casing is rotatable relative to the first casing only in a first rotation direction that causes the display to face the projecting component in the course of the normally opened position being switched to the inversely opened position, and the second casing is rotatable relative to the first casing only in a second rotation direction opposite to the first rotation direction in the course of the inversely opened position being switched to the normally opened position.

* * * * *